United States Patent
Miyajima (10) Patent No.: US 7,196,769 B2
(45) Date of Patent: Mar. 27, 2007

(54) EXPOSURE APPARATUS AND DEVICE MANUFACTURING METHOD

(75) Inventor: Yoshikazu Miyajima, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 46 days.

(21) Appl. No.: 11/149,532

(22) Filed: Jun. 10, 2005

(65) Prior Publication Data

US 2005/0275821 A1    Dec. 15, 2005

(30) Foreign Application Priority Data

Jun. 14, 2004  (JP)  ............................. 2004-175586

(51) Int. Cl.
G03B 27/52 (2006.01)
G03B 27/42 (2006.01)
G03B 27/54 (2006.01)
G03B 27/32 (2006.01)

(52) U.S. Cl. ............................. 355/30; 355/53; 355/67; 355/77

(58) Field of Classification Search .................. 355/30, 355/53, 67, 77
See application file for complete search history.

(56) References Cited

U.S. PATENT DOCUMENTS

| | | | |
|---|---|---|---|
| 6,153,044 A * | 11/2000 | Klebanoff et al. ........ | 156/345.3 |
| 6,359,678 B1 | 3/2002 | Ota ............................. | 355/53 |
| 6,414,323 B1 | 7/2002 | Abe et al. ................. | 250/443.1 |
| 6,459,472 B1 * | 10/2002 | De Jager et al. ............... | 355/68 |
| 6,614,505 B2 * | 9/2003 | Koster et al. .................. | 355/30 |
| 2001/0016302 A1 | 8/2001 | Hirayanagi et al. ......... | 430/322 |
| 2002/0041368 A1 | 4/2002 | Ota et al. ...................... | 355/55 |
| 2002/0109828 A1 * | 8/2002 | Moors et al. ................. | 355/76 |
| 2005/0128446 A1 | 6/2005 | Miyajima ..................... | 355/30 |
| 2005/0140947 A1 | 6/2005 | Miyajima ..................... | 355/30 |
| 2005/0168712 A1 | 8/2005 | Miyajima ..................... | 355/30 |

FOREIGN PATENT DOCUMENTS

| JP | 7-263322 | 10/1995 |
|---|---|---|
| JP | 2002-50568 | 2/2002 |

* cited by examiner

*Primary Examiner*—Alan Mathews
(74) *Attorney, Agent, or Firm*—Fitzpatrick, Cella, Harper & Scinto (57) ABSTRACT

An exposure apparatus for projecting a pattern of an original onto a substrate using exposure light includes a projection optical system to project the pattern onto the substrate; a shielding structure, having an opening through which the exposure light passes, to shield the projection optical system from an outside environment; and an attraction system, including at least one of a panel to generate an electric field and a cryogenic panel arranged to face a path of the exposure light passing through the opening, to attract contaminants.

11 Claims, 9 Drawing Sheets

EXPOSURE APPARATUS AND DEVICE MANUFACTURING METHOD

BACKGROUND OF THE INVENTION

1. Field of the Invention

The present invention relates to exposure apparatuses, in which a pattern of an original plate is projected on a substrate, for use in a semiconductor manufacturing process, and in particular relates to a lithography machine using EUV light (extreme ultraviolet light) as exposure light.

2. Description of the Related Art

Figure 5:
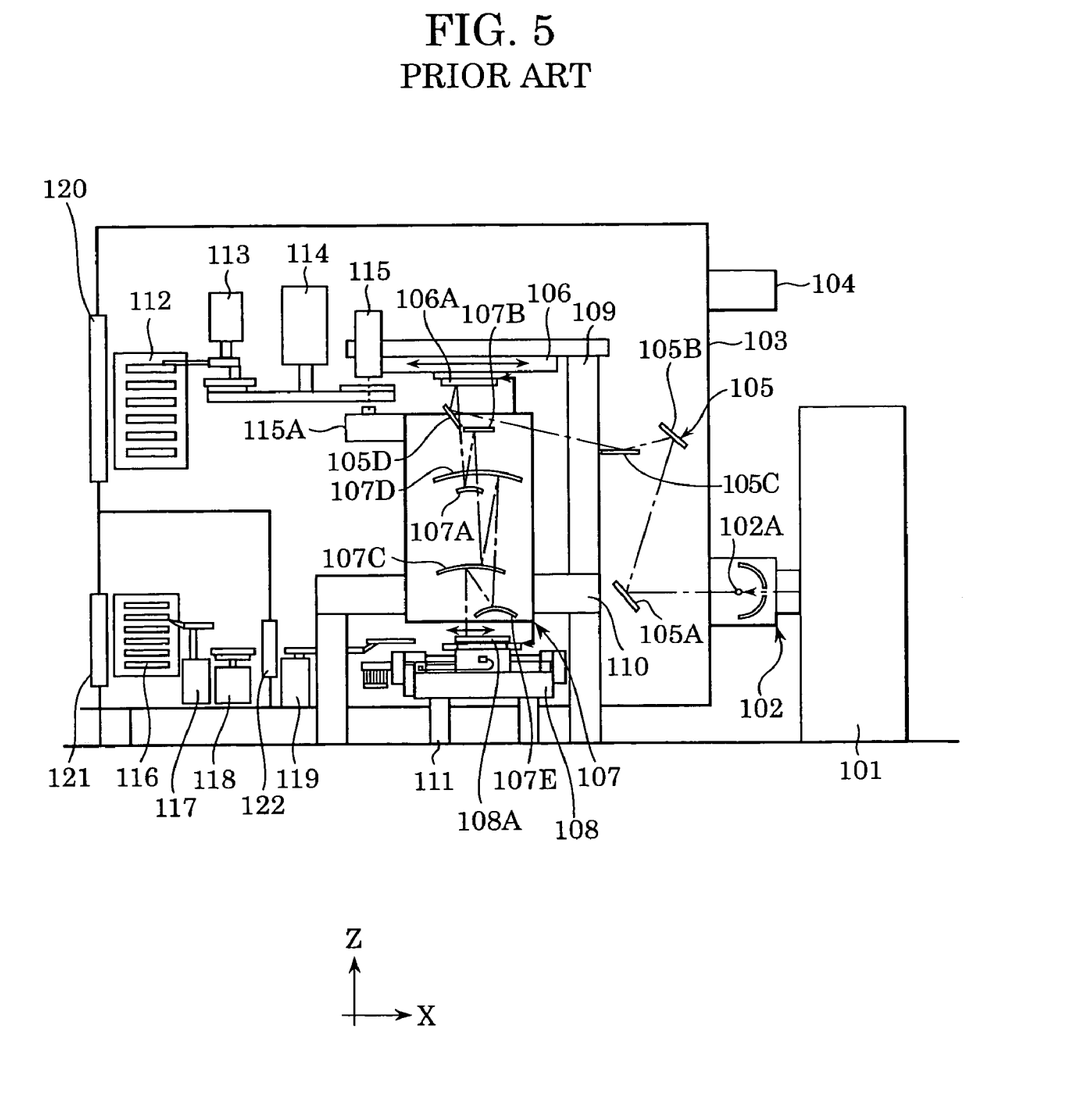
FIG. 5 is a drawing showing the entire of a conventional exposure apparatus.
Figure 6:
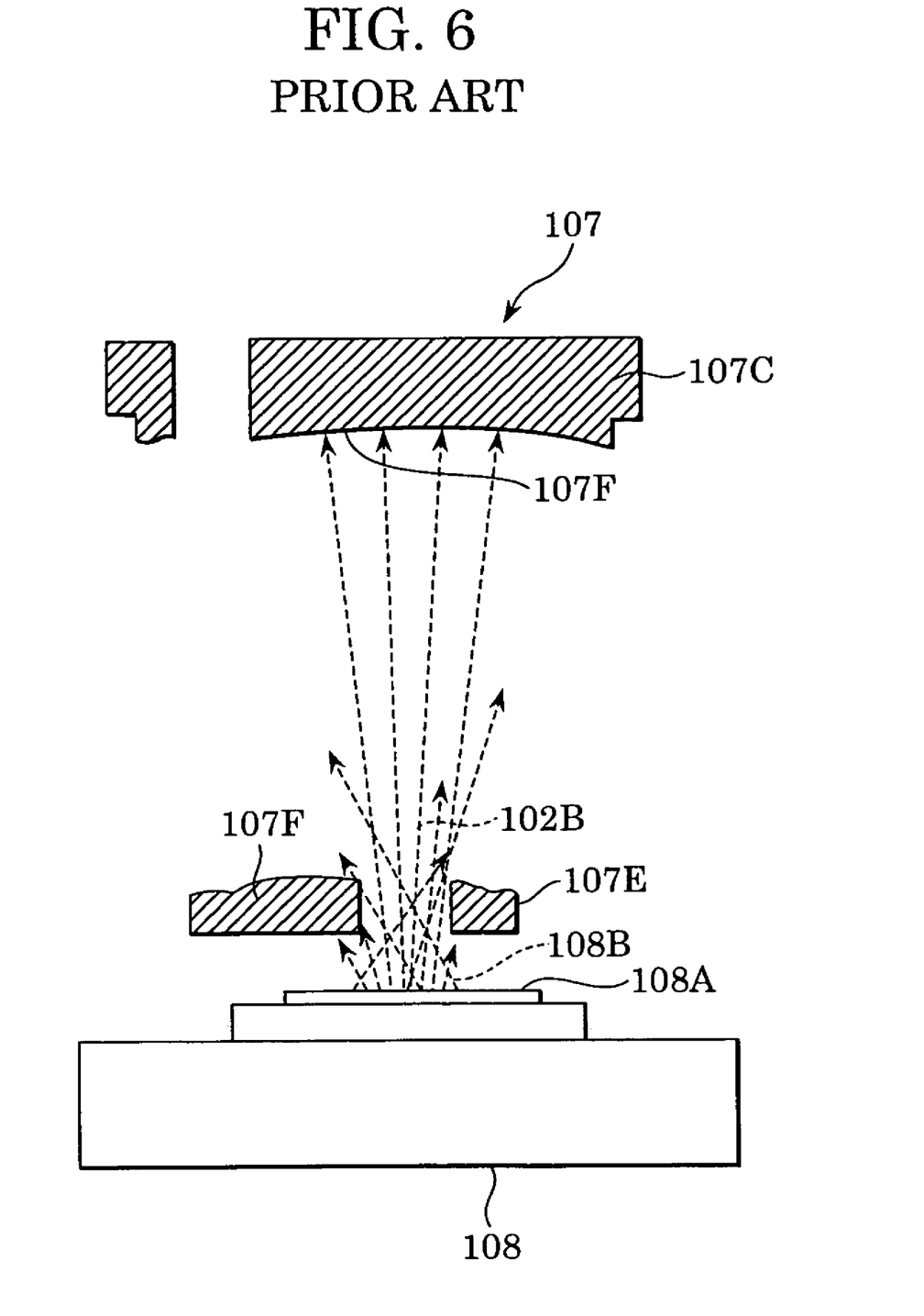
FIG. 6 is a structural drawing of a conventional projection optical system.

An example in the related art is shown in FIGS. 5 and 6. A pumping laser 101, such as a YAG (yttrium aluminum garnet) solid laser, irradiates with the laser a luminescent point of a light source where a light source material is evaporated, condensed, or atomized so as to make the light source material radiate by plasma excitation.

A luminescent light source unit 102 has a structure maintained under vacuum. A light source 102A is a luminescent point of exposure light.

A vacuum chamber 103 accommodates the entire exposure apparatus, and is maintained to form a vacuum by a vacuum pump 104.

An exposure light entry site 105 leads the exposure light from the luminescent light source unit 102, and is composed of mirrors A to D denoted by 105A to 105D, respectively, so as to homogenize and shape the exposure light.

On a moving part of a reticle stage 106, a reflection original plate 106A having a pattern to be transcribed on a substrate is mounted.

A mirror optical system 107 projects the pattern of the original plate 106A so as to reduce it. That is, the light reflected from the original plate 106A is sequentially reflected by mirrors A to E denoted by 107A to 107E, respectively, so as to form the pattern of the original plate on a substrate with a predetermined demagnification factor.

A wafer 108A, which is a Si substrate having the pattern on the original plate 106A projected thereon under demagnification, is mounted on a wafer stage 108 and positioned at a predetermined exposure position. The wafer stage 108 moves with six degrees of freedom, which are translations in X, Y, and Z directions, tilts about the X and Y axes, and a rotation about the Z axis.

A reticle stage support 109 supports the reticle stage 106 on an installation floor.

A projection system support 110 supports the reduced projection mirror optical system 107 on the installation floor.

A wafer stage support 111 supports the wafer stage 108 on the installation floor.

Control units for measuring and controlling relative position (not shown) are provided between the reticle stage 106 and the reduced projection mirror optical system 107 and between the wafer stage 108 and the reduced projection mirror optical system 107, respectively, so as to maintain predetermined relative positions.

The reticle stage support 109, the projection system 110, and the wafer stage support 111 are provided with a mount (not shown) for isolating from the vibration of the installation floor, respectively.

A reticle stocker 112 houses the original plate 106A (reticle) conveyed within the system from outside, and a plurality of the reticles enclosed in a container can be accommodated therein.

A reticle changer 113 selects the reticle to be used from the reticle stocker 112 and conveys it.

A reticle alignment unit 114 includes a rotary hand which can be moved in the X, Y, and Z directions and is rotatable about the Z axis. The original plate 106A received from the reticle changer 113 is rotated by 180° and conveyed to a part of a reticle alignment scope 115 provided at the end of the reticle stage 106 so as to slightly move for alignment relative to an alignment mark 115A provided based on the reduced projection mirror optical system 107.

The aligned original plate 106A is chucked on the reticle stage 106.

A wafer stocker 116 stores the wafer 108A conveyed within the system from outside, and a plurality of the wafers are accommodated.

A wafer conveying robot 117 selects the wafer 108A to be exposed from the wafer stocker 116 so as to convey it to a wafer mechanical pre-alignment air conditioner 118.

In the wafer mechanical pre-alignment air conditioner 118, the rotational position of the wafer about the Z axis is roughly adjusted while the wafer temperature is matched with that of the inside of the air-conditioned exposure apparatus.

A wafer feed hand 119 feeds the wafer 108A aligned and air-conditioned in the wafer mechanical pre-alignment air conditioner 118 to the wafer stage 108.

Gate valves 120 and 121 have gate closing mechanisms for use during conveying the reticle and wafer from outside.

Also, a gate valve 122 opens and closes only when the wafer 108A is conveyed through a barrier between spaces of the wafer stocker 116 and the wafer mechanical pre-alignment air conditioner 118 and the exposure space.

In such a manner, by separating the inside of the system with the barrier, the air volume once vented to the atmosphere when the wafer 108A is conveyed to and from the outside is minimized, enabling rapid return to the vacuum.

In such a conventional exposure apparatus, as shown in FIG. 6, a gas (degassing out resist gas) 108B generated from a resist applied on the wafer 108A during exposure contaminates the vacuum atmosphere so as to produce a stuck contaminant 107F on the respective reflection surfaces of the mirrors A to E of the reduced projection mirror optical system 107. Thereby, the wave aberration of the mirror optical system is deteriorated or the reflectance thereof is reduced, so that the very severe accuracy demanded for the reflecting projection optical system cannot be satisfied.

These as a whole lead to the deterioration of fundamental performances of the exposure apparatus such as exposure accuracies and throughputs.

SUMMARY OF THE INVENTION

The present invention provides a new technology suppressing the contamination of an optical element.

An exposure apparatus for projecting a pattern of an original onto a substrate using exposure light according to one aspect of the present invention includes a projection optical system to project the pattern onto the substrate; a shielding structure, having an opening through which the exposure light passes, to shield the projection optical system from an outside environment; and an attraction system, including at least one of a panel to generate an electric field and a cryogenic panel arranged to face a path of the exposure light passing through the opening, to attract contaminants.

A method of projecting a pattern of an original onto a substrate using exposure light according to another aspect of the present invention includes the steps of projecting the pattern onto the substrate through a projection optical system; passing the exposure light through an opening in a shielding structure for shielding the projection optical system from an outside environment; and attracting contaminants by at least one of a panel to generate an electric field and a cryogenic panel arranged to face a path of the exposure light passing through the opening.

According to the present invention, a new technique for suppressing the contamination of an optical element can be provided.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 4Aa and 4Ab are structural drawings of a projection optical system according to a third embodiment of the present invention.

FIGS. 4Ba and 4Bb are structural drawings of a projection optical system according to a fourth embodiment of the present invention.

FIGS. 4Ca and 4Cb are structural drawings of a projection optical system according to a fifth embodiment of the present invention.

DESCRIPTION OF THE EMBODIMENTS

Preferred embodiments according to the present invention will be described below in detail by an example where an original plate is a reticle or a mask and a substrate is a wafer with reference to the drawings. The embodiments are shown in FIGS. 1 to 4 and 7.

(First Embodiment)

Figure 1:
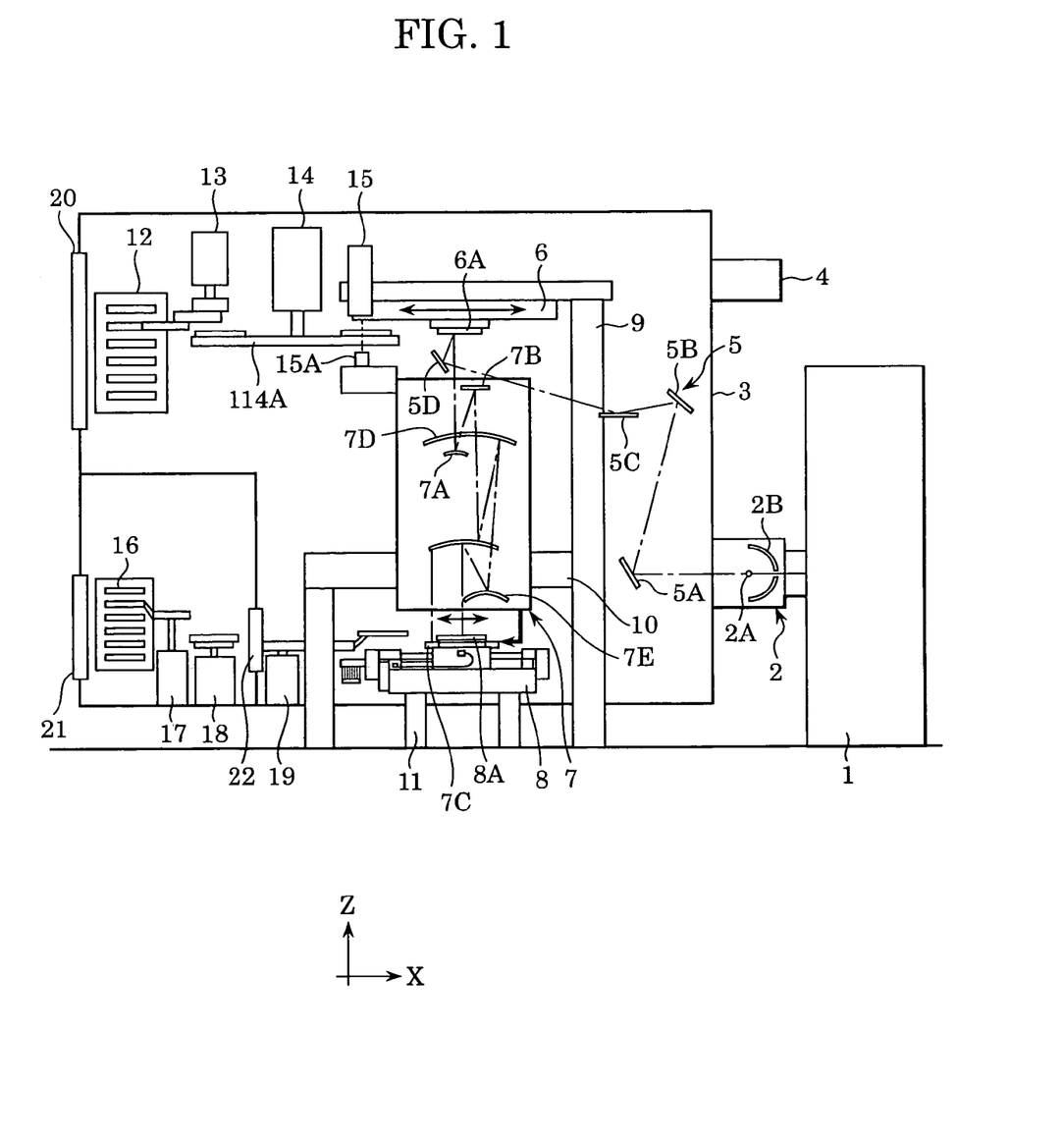
FIG. 1 is an elevation view of the entire of an exposure apparatus according to a first embodiment of the present invention.

A first embodiment according to the present invention will be described with reference to FIGS. 1 and 2.

A pumping laser 1 irradiates with laser light a luminescent point of a light source where a light source material is evaporated, condensed, or atomized so as to make the light source material atoms radiate by plasma excitation. The pumping laser 1 uses a YAG (yttrium aluminum garnet) solid laser, for example.

A luminescent light source unit 2 for exposure has a structure maintained in vacuum. The inside structure of the luminescent light source unit 2 is shown in FIG. 2, and numeral 2A denotes a luminescent point of the exposure light source.

A vacuum chamber 3 accommodates the entire exposure apparatus, and can maintain a vacuum condition by means of a vacuum pump 4.

An exposure light entry site 5 guides the exposure light from the luminescent light source unit 2, and is composed of mirrors A to D denoted by 5A to 5D, respectively, so as to homogenize and shape the exposure light.

On a moving part of a reticle stage 6, a reflection original plate 6A is mounted.

A mirror optical system 7 has mirrors A to E denoted by 7A to 7E, respectively, and projects the pattern of the original plate 6A so as to reduce it with a predetermined demagnification factor.

A wafer 8A, which is a Si substrate having the pattern on the original plate 6A projected thereon under demagnification, is mounted on a wafer stage 8 and positioned at a predetermined exposure position. The wafer stage 8 is movable with six degrees of freedom, which are translations in X, Y, and Z directions, tilts about the X and Y axes, and a rotation about the Z axis.

A reticle stage support 9 supports the reticle stage 6 on an installation floor.

A projection system body 10 supports the reduced projection mirror optical system 7 on the installation floor.

A wafer stage support 11 supports the wafer stage 8 on the installation floor.

Control units for measuring and controlling the relative position (not shown) are provided between the reticle stage 6 and the reduced projection mirror optical system 7 and between the wafer stage 8 and the reduced projection mirror optical system 7, respectively, so as to maintain predetermined relative positions.

The reticle stage support 9, the projection system body 10, and the wafer stage support 11 are provided with a mount (not shown) for isolating from the vibration of the installing floor, respectively.

A reticle stocker 12 houses the original plate 6A (reticle) conveyed within the system from outside, and the reticles enclosed in containers are accommodated therein. A plurality of the reticles corresponding to various patterns and exposure conditions can be accommodated in the reticle stocker 12.

A reticle changer 13 selects the reticle to be used from the reticle stocker 12 and conveys it.

A reticle alignment unit 14 includes a reticle alignment hand which can be moved in the X, Y, and Z directions and is rotatable about the Z axis. The original plate 6A received from the reticle changer 13 therein is rotated by 180° and conveyed to part of a reticle alignment scope 15 provided at the end of the reticle stage 6 so as to slightly move in the X, Y, and Z directions for alignment relative to an alignment mark 15A provided based on the reduced projection mirror optical system 7.

The aligned original plate 6A is chucked on the reticle stage 6.

A wafer stocker 16 stores once the wafer 8A conveyed within the system from outside, and a plurality of the wafers are accommodated.

A wafer conveying robot 17 selects the wafer 8A to be exposed from the wafer stocker 16 so as to convey it to a wafer mechanical pre-alignment air conditioner 18.

In the wafer mechanical pre-alignment air conditioner 18, the rotational position of the wafer is roughly adjusted while the wafer temperature is matched with that of the inside of the air-conditioned exposure apparatus.

A wafer feed hand 19 feeds the wafer 8A aligned and air-conditioned in the wafer mechanical pre-alignment air conditioner 18 to the wafer stage 8.

Gate valves 20 and 21 are for opening/closing a gate during conveying the reticle and wafer from outside.

Also, a gate valve 22 opens/closes only when the wafer 8A is conveyed through a barrier between the spaces of the wafer stocker 16 and the wafer mechanical pre-alignment air conditioner 18 and the exposure space.

In such a manner, by separating the inside the system with the barrier, the air volume once vented to the atmosphere when the wafer 8A is conveyed to and from the outside is minimized, enabling the rapid return to the vacuum condition of the vacuum chamber 3.

In the exposure apparatus constructed as described above, according to the embodiment, a gas eliminating unit for removing gas produced from the resist on the wafer is provided in order to solve the contamination problem on the surface of the mirror.

Figure 2:
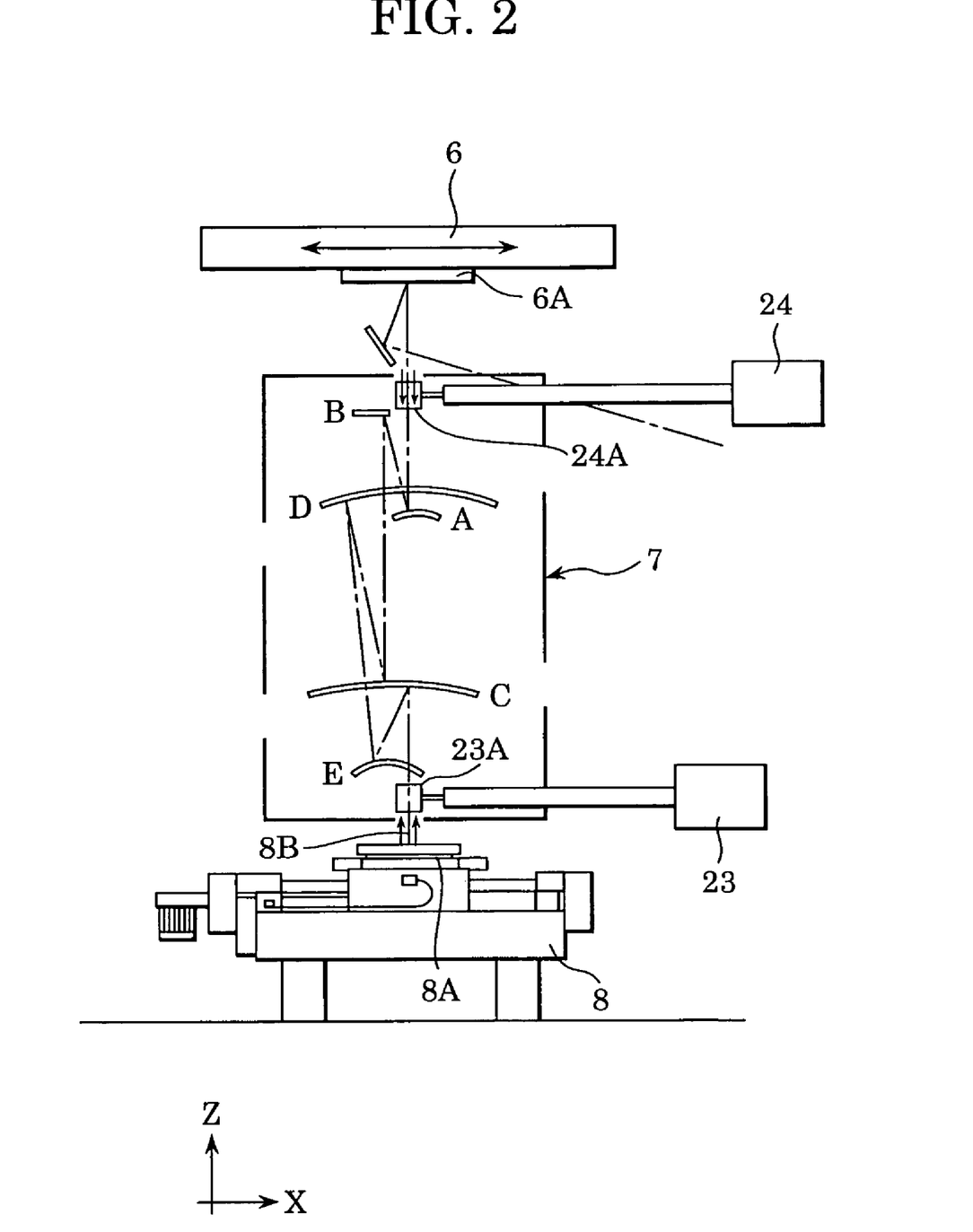
FIG. 2 is an elevation view of the essential part of the exposure apparatus according to the first embodiment of the present invention.

FIG. 2 shows an example of the gas eliminating unit. The reduced projection mirror optical system 7 constructed within the vacuum chamber 3 is substantially covered to suppress the effect of a degassing-out resist gas 8B from the wafer 8A. However, in order to maintain the vacuum within the reduced projection mirror optical system 7, necessary openings are provided. A portion through which exposure light passes is also provided with an opening.

According to the embodiment, a cryogenic panel 23A maintained at a very low temperature (<100 K) by a cryogenic refrigerator 23 is provided inside the reduced projection mirror optical system 7 at a position closest to the opening for allowing exposure light to permeate. Thereby, the degassing-out resist gas 8B is attracted to and captured by the cryogenic panel 23A, suppressing the degassing-out resist gas 8B from approaching the mirror in the reduced projection mirror optical system 7.

Also, a cryogenic panel 24A maintained at a very low temperature (<100 K) by a cryogenic refrigerator 24 is provided inside the reduced projection mirror optical system 7 at a position closest to the opening for allowing exposure light to permeate. Thereby, a degassing-out gas (indicated by symbol ↓ in the drawing) from the space of the reticle stage 6 is attracted to and captured by the cryogenic panel 24A, suppressing the degassing-out gas from approaching the mirror in the reduced projection mirror optical system 7.

(Second Embodiment)

Figure 3:
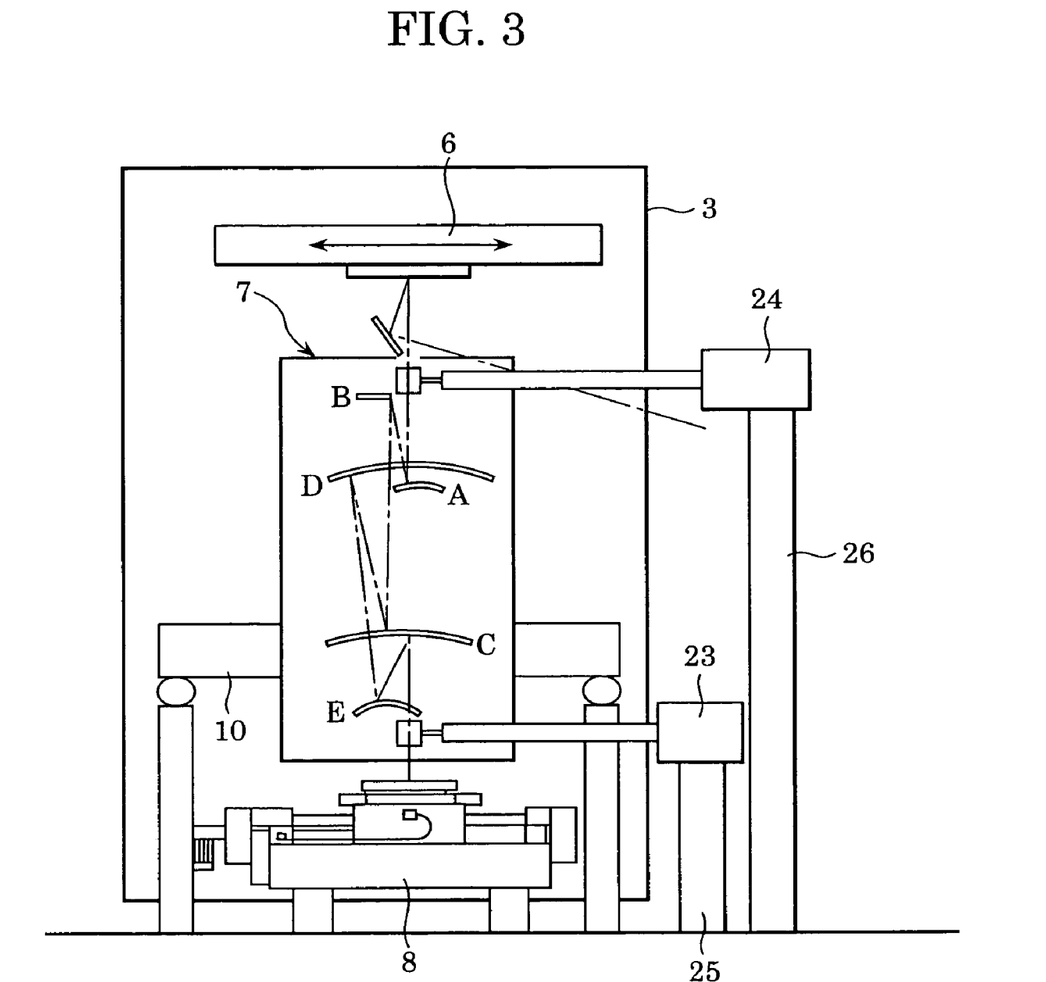
FIG. 3 is a drawing of an entire of an exposure apparatus according to a second embodiment of the present invention.
Figure 4:
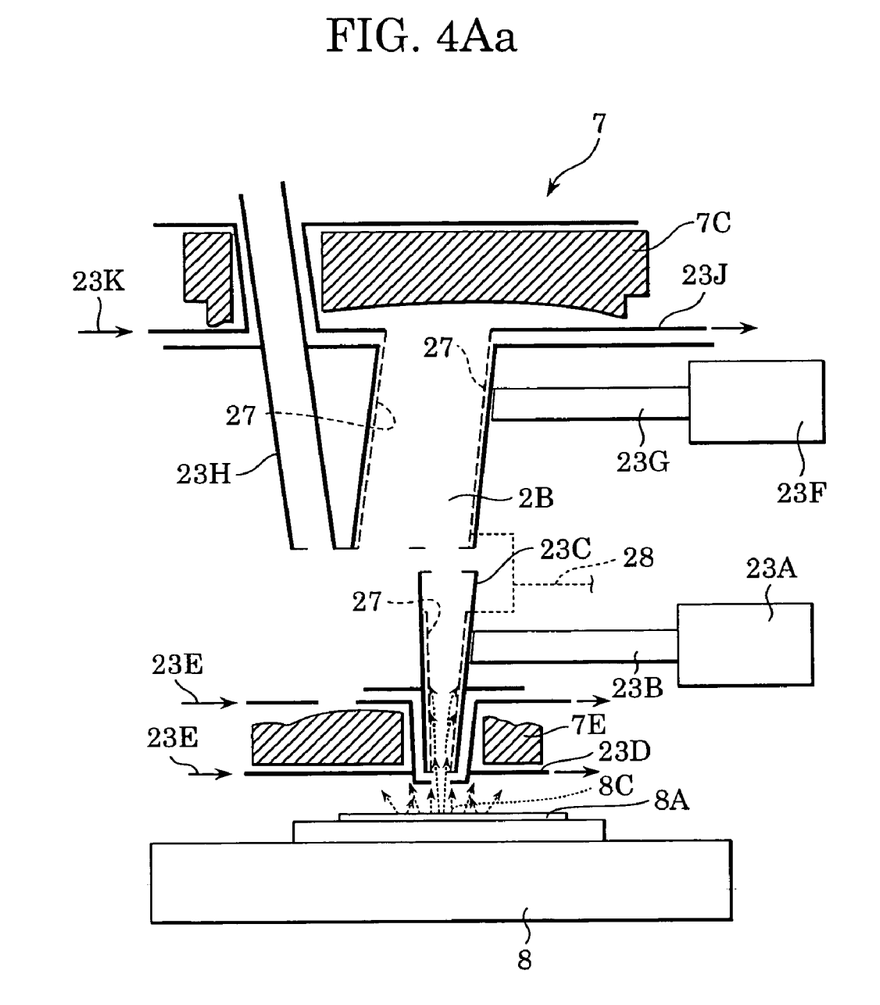

An exposure apparatus according to a second embodiment of the present invention is shown in FIG. 3.

According to the embodiment, the reduced projection mirror optical system 7 is held to the floor and isolated from vibration with the projection system support 10. Since in the cryogenic refrigerators 23 and 24, vibration during heat exchange operation of the refrigerator is large, the cryogenic refrigerators 23 and 24 are separately supported on supports 25 and 26, respectively. Thereby, the vibration from the cryogenic refrigerator to the projection system support 10 is blocked, so that the vibration transmission to the reduced projection mirror optical system 7 and the strain generation can be suppressed so as to suppress deterioration in exposure accuracy.

(Third Embodiment)

A projection optical system according to a third embodiment of the present invention is shown in FIG. 4Aa.

According to the embodiment, in order to increase the attraction and capturing effect of the degassing gas further from the first embodiment, an electric field trapping unit is provided.

In this projection optical system, a cryogenic refrigerator 23A and a cryogenic air conditioning tube 23B are provided at a position close to the mirror 7E, and a cryogenic refrigerator 23F and a cryogenic air conditioning tube 23G are provided at a position close to the mirror 7C, while between the mirrors 7C and 7E, an electric field trap panel 27 is provided at a position close to a degassing resist gas trapping panel 23C. By applying a potential through an electric field applying line 28, the electric field trap panel 27 generates an electric field. Ingredients of an ionized gas 8C are trapped, so that the attraction and capturing effect of the degassing resist gas can be further improved along with the cryogenic trap (FIG. 4Ab).

In the vicinity of the mirror C, a heat-insulating air conditioning plate 23J is arranged while in the vicinity of the mirror 7E, a heat-insulating air conditioning plate 23D is arranged, so that heat-insulating air conditioning coolants 23K and 23D are supplied to the heat-insulating air conditioning plates, respectively. Reference numeral 23H denotes a degassing resist gas trap panel arranged between the mirrors 7D and 7E.

(Fourth Embodiment)

A projection optical system according to a fourth embodiment of the present invention is shown in FIG. 4Ba. In FIG. 4Ba, like reference numerals designate like components common to FIG. 4Aa, and the description is omitted.

According to the embodiment, the electric field trap unit is provided separately from a cold trap unit with regard to the third embodiment. As shown in FIG. 4B, the electric field trap unit is arranged at a position close to the wafer surface, and ingredients of the degassing resist gas, which are not captured by the electric field trap unit, are captured by the cold trap unit.

By applying a potential through an electric field applying line 28, the electric field trap panel 27 generates an electric field.

Ingredients of the ionized gas 8C are trapped, so that the attraction and capturing effect of the degassing resist gas can be further improved along with the cryogenic trap (FIG. 4Bb).

(Fifth Embodiment)

A projection optical system according to a fifth embodiment of the present invention is shown in FIG. 4C. In FIG. 4Ca, like reference numerals designate like components common to FIG. 4Aa, and the description is omitted.

According to the embodiment, another method is provided for separately providing the electric field trap unit and the cold trap unit. In this case, as shown in FIG. 4Ca, the electric field trap unit is arranged at a position close to the surface of a reflection mirror, and ingredients of the degassing resist gas, which are not captured by the electric field trap unit, are captured by the cold trap unit at a position remote from the reflection mirror. In this structure, providing the electric field trap unit scarcely thermally affecting the reflection mirror on a surface close to the reflection mirror suppresses the thermal effect on the reflection surface such as distortion.

By applying a potential through an electric field applying line 28, the electric field trap panel 27 generates an electric field (FIG. 4Cb).

Ingredients of the ionized gas 8C are trapped, so that the attraction and capturing effect of the degassing resist gas can be further improved along with the cryogenic trap.

By this structure, the electric field trap panel may also be used as an air conditioning unit for suppressing the effect of cryogenic disturbance on the reflection mirror from the cold trap panel.

(Sixth Embodiment)

Figure 7:
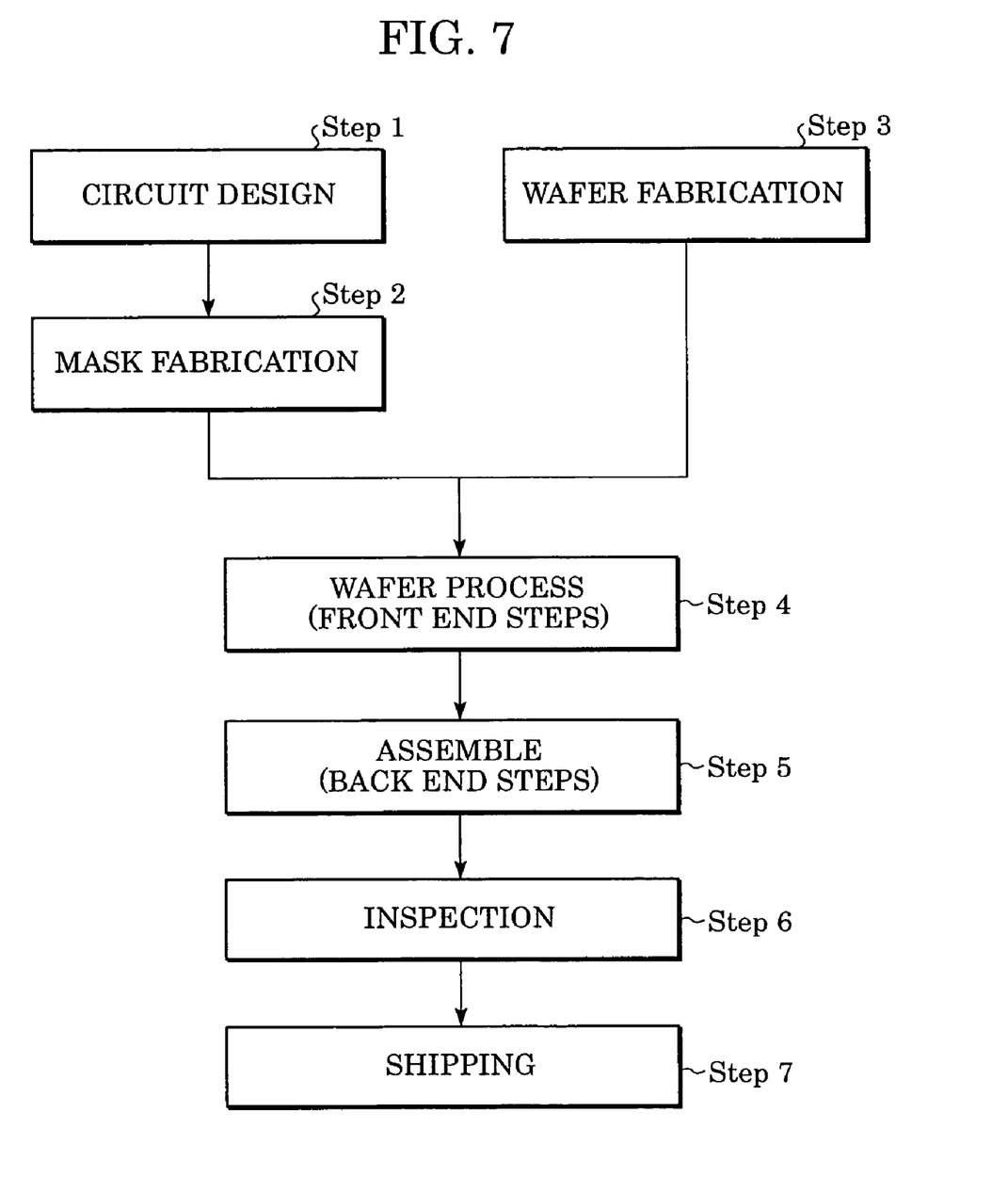
FIG. 7 is a flowchart of the entire manufacturing process of semiconductor devices.

Then, a manufacturing process of semiconductor devices according to a sixth embodiment using the exposure apparatus will be described. FIG. 7 is a flowchart of the entire manufacturing process of the semiconductor devices. At Step 1 (circuit design), the circuit of the semiconductor device is designed. At Step 2 (mask fabrication), a mask is fabricated based on the designed circuit pattern.

On the other hand, at Step 3 (wafer fabrication), a wafer is fabricated using a material such as silicon. At Step 4 (wafer process) which is referred to as the front-end steps, using the above-mentioned mask and wafer, the practical circuit is formed on the wafer by the lithographic technique in the exposure apparatus. At next Step 5 (assemble) which is referred to as the back-end steps, using the wafer fabricated at Step 4, a semiconductor chip is assembled including an assembly process (dicing and bonding) and a packaging process (chip inclusion). At Step 6 (inspection), the semiconductor device fabricated at Step 5 is inspected in the operation confirmation and durability test. The semiconductor device is completed through these Steps so that at Step 7, it is shipped.

The wafer process at Step 4 includes: an oxidation step of oxidizing the wafer surface; a CVD step of depositing an insulating film on the wafer surface; an electrode forming step of evaporating an electrode on the wafer; an ion implantation step of implanting ions on the wafer; a resist process step of applying a sensitizer on the wafer; an exposure step of transferring a circuit pattern on the resist-processed wafer by the exposure apparatus; a developing step of developing the wafer exposed at the exposing step; an etching step of cutting off parts other than resist images developed at the developing Step; and a resist peeling step of removing the unnecessary resist after etching. By repeating these steps, multiple circuit patterns are formed on the wafer.

According to the embodiments described above, the deterioration in wave aberration of a mirror optical system and the reduction in reflectance of the mirror can be suppressed by capturing a degassing gas. Hence, the very high accuracy demanded for the reflecting projection optical system can be satisfied, resulting in improvement of fundamental performances of the exposure apparatus such as exposure accuracies and throughputs.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2004-175586, entitled "EXPOSURE APPARATUS" and filed on Jun. 14, 2004, the entire contents of which are incorporated herein by reference.

What is claimed is:

1. An exposure apparatus for exposing a substrate to light via an original, said apparatus comprising:
    a projection optical system configured to project light from the original onto the substrate;
    a shielding structure having an opening through which light passes and configured to shield said projection optical system;
    a cryogenic panel facing a path of light passing through the opening and configured to attract contaminants;
    a first support configured to support said projection optical system;
    a refrigerator configured to refrigerate said cryogenic panel; and
    a second support different from said first support, and configured to support said refrigerator.

2. An apparatus according to claim 1, further comprising:
    an original stage configured to hold the original; and
    a substrate stage configured to hold the substrate,
    wherein said cryogenic panel is arranged in at least one of a space between said original stage and the first surface of said projection optical system and a space between the last surface of said projection optical system and said substrate stage.

3. An apparatus according to claim 1, wherein said cryogenic panel is arranged in a notch of an optical element included in said projection optical system.

4. An apparatus according to claim 1, wherein said apparatus is configured to expose the substrate to extreme ultraviolet light.

5. An apparatus according to claim 1, further comprising a chamber configured to keep a space including the path in a vacuum.

6. A method of manufacturing a device, said method comprising steps of:
    exposing a substrate to light using an exposure apparatus as defined in claim 1;
    developing the exposed substrate; and
    processing the developed substrate to manufacture the device.

7. An exposure apparatus for exposing a substrate to light via an original, said apparatus comprising:
    a projection optical system configured to project light from the original onto the substrate;
    a shielding structure having an opening through which light passes and configured to shield said projection optical system;
    a panel facing a path of light passing through the opening, configured to generate an electrical field, and configured to attract contaminants; and
    a cryogenic panel facing a path of light passing through the opening and configured to attract contaminants,
    wherein said panel configured to generate the electrical field and said cryogenic panel are arranged at respective portions so as to overlap each other in a direction along the path.

8. An exposure apparatus for exposing a substrate to light via an original, said apparatus comprising:
    a projection optical system configured to project light from the original onto the substrate;
    a shielding structure having an opening through which light passes and configured to shield said projection optical system;
    a panel facing a path of light passing through the opening, configured to generate an electrical field, and configured to attract contaminants; and
    a cryogenic panel facing a path of light passing through the opening and configured to attract contaminants, wherein said panel configured to generate the electrical field and said cryogenic panel are arranged at respective positions different from each other in a direction along the path.

9. An exposure apparatus for exposing a substrate to light via an original, said apparatus comprising:
   a projection optical system configured to project light from the original onto the substrate;
   a shielding structure having an opening through which light passes and configured to shield said projection optical system;
   a panel facing a path of light passing through the opening, configured to generate an electrical field, and configured to attract contaminants; and
   a cryogenic panel facing a path of light passing through the opening and configured to attract contaminants,
   wherein said cryogenic panel is arranged farther than said panel configured to generate the electrical field is arranged from an optical element included in said projection optical system.

10. An apparatus according to claim 9, wherein said panel configured to generate the electrical field is controlled so that said panel configured to generate the electrical field reduces thermal disturbance from said cryogenic panel to said optical element.

11. An exposure apparatus for exposing a substrate to light via an original, said apparatus comprising:
   a projection optical system configured to project light from the original onto the substrate;
   a shielding structure having an opening through which light passes and configured to shield said projection optical system;
   a cryogenic panel facing a path of light passing through the opening and configured to attract contaminants; and
   a heat insulator arranged between said cryogenic panel and an optical element included in said projection optical system and configured to reduce thermal disturbance from said cryogenic panel to said optical element.

* * * * *